(12) United States Patent
Kim et al.

(10) Patent No.: US 12,219,710 B2
(45) Date of Patent: Feb. 4, 2025

(54) DISPLAY APPARATUS

(71) Applicant: Samsung Display Co., LTD., Yongin-si (KR)

(72) Inventors: Wontae Kim, Hwaseong-si (KR); Jae-Han Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 843 days.

(21) Appl. No.: 17/324,648

(22) Filed: May 19, 2021

(65) Prior Publication Data

US 2021/0392751 A1 Dec. 16, 2021

(30) Foreign Application Priority Data

Jun. 10, 2020 (KR) .................. 10-2020-0070316

(51) Int. Cl.
| | |
|---|---|
| *H05K 1/18* | (2006.01) |
| *G02F 1/1345* | (2006.01) |
| *G09F 9/30* | (2006.01) |
| *G09G 3/00* | (2006.01) |
| *H01L 23/13* | (2006.01) |
| *H01L 23/538* | (2006.01) |

(Continued)

(52) U.S. Cl.
CPC ......... *H05K 1/181* (2013.01); *G02F 1/13452* (2013.01); *G09F 9/30* (2013.01); *G09G 3/006* (2013.01); *H01L 23/13* (2013.01); *H01L 23/5385* (2013.01); *H01L 23/5386* (2013.01); *H05K 1/111* (2013.01); *H05K 1/118* (2013.01); *H10K 59/131* (2023.02); *G02F 1/13458* (2013.01); *H01L 23/5387* (2013.01); *H05K 1/147* (2013.01); *H05K 1/189* (2013.01); *H05K 2201/10128* (2013.01)

(58) Field of Classification Search
CPC ........ H05K 1/181; H05K 1/111; H05K 1/118; H05K 1/147; H05K 1/189; H05K 2201/10128; G02F 1/13452; G02F 1/13458; G09F 9/30; G09G 3/20; G09G 3/006; H01L 23/13; H01L 23/5385; H01L 23/5386; H01L 23/5387; H10K 59/131
See application file for complete search history.

(56) References Cited

U.S. PATENT DOCUMENTS

2005/0241853 A1* 11/2005 Aoki .................. G02F 1/1345
361/777
2017/0098769 A1* 4/2017 Im ..................... H10K 59/131
(Continued)

FOREIGN PATENT DOCUMENTS

| KR | 10-2014-0122481 | 10/2014 |
| KR | 10-2019-0025091 | 3/2019 |
| KR | 10-2019-0129153 | 11/2019 |

*Primary Examiner* — Roshn K Varghese

(74) *Attorney, Agent, or Firm* — KILE PARK REED & HOUTTEMAN PLLC

(57) ABSTRACT

A display apparatus includes a display panel, a printed circuit board, a first film electrically connected to the display panel and the printed circuit board, and a second film electrically connected to the display panel and the printed circuit board. The display panel includes panel pads of a first row electrically connected to the first film, panel pads of a second row electrically connected to the second film, and panel connecting lines electrically connecting the panel pads of the first row to the panel pads of the second row.

22 Claims, 8 Drawing Sheets

(51) Int. Cl.
    *H05K 1/11*     (2006.01)
    *H10K 59/131*     (2023.01)
    *H05K 1/14*     (2006.01)

(56) References Cited

U.S. PATENT DOCUMENTS

2018/0068992 A1*   3/2018   Oh ........................ G02F 1/13452
2019/0064239 A1*   2/2019   Lee ......................... G01R 31/70

* cited by examiner

DISPLAY APPARATUS

CROSS-REFERENCE TO RELATED APPLICATION(S)

This application claims priority to and benefits of Korean Patent Application No. 10-2020-0070316 under 35 U.S.C. § 119, filed on Jun. 10, 2020 in the Korean Intellectual Property Office, the entire contents of which are incorporated herein by reference.

BACKGROUND

1. Field

Embodiments of the disclosure relate to a display apparatus, more particularly, to a display apparatus including chip-on-film structures.

2. Description of the Related Art

Generally, a display apparatus includes a display panel and a display panel driver. The display panel displays an image based on input image data or signals. The display panel includes gate lines, data lines, and pixels. The display panel driver includes a gate driver, a data driver, and a driving controller. The gate driver outputs gate signals to the gate lines. The data driver outputs data voltages to the data lines. The driving controller controls the gate driver and the data driver.

Some elements of the display panel driver may be integrated on the display panel, may be connected to the display panel as chip-on-film type elements, may be mounted on the display panel as chip-on-glass type elements, or may be disposed on a separate printed circuit board and connected to the display panel through a flexible printed circuit board.

When the elements of the display panel driver are implemented as chip-on-film type elements, defects may occur in the bonding between the film and the printed circuit board and in the bonding between the film and the display panel. Such defects may affect or reduce the yield of the display apparatus.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure provide a display apparatus including chip-on-film structures that may effectively inspect the bonding of the chip-on-film structure.

In an embodiment of a display apparatus, the display apparatus includes a display panel, a printed circuit board, a first film electrically connected to the display panel and the printed circuit board and a second film electrically connected to the display panel and the printed circuit board. The display panel includes panel pads of a first row electrically connected to the first film, panel pads of a second row electrically connected to the second film and panel connecting lines connecting the panel pads of the first row to the panel pads of the second row.

In an embodiment, the first film may include a first film pad, a second film pad, a third film pad and a fourth film pad which are electrically connected to the printed circuit board, a fifth film pad, a sixth film pad, a seventh film pad and an eighth film pad which may be electrically connected to the panel pads of the first row, a first film line electrically connecting the first film pad and the fifth film pad, a third film line electrically connecting the third film pad and the seventh film pad, a fourth film line electrically connecting the fourth film pad and the eighth film pad and a second film line electrically connecting the second film pad and the third film line.

In an embodiment, the second film may include a first pad, a second pad, a third pad and a fourth pad which may be electrically connected to the panel pads of the second row.

In an embodiment, the second film may include a connecting line electrically connecting the first pad, the third pad and the fourth pad.

In an embodiment, a bonding of the first film and a bonding of the second film may be determined by applying a current to the fourth film pad and measuring voltages at the first film pad and the second film pad.

In an embodiment, the display panel may include an align pattern electrically connected to at least one of the panel pads of the second row.

In an embodiment, the second film may include a fifth pad, a sixth pad, a seventh pad and an eighth pad which are electrically connected to the printed circuit board, a ninth pad, a tenth pad, an eleventh pad and a twelfth pad which are electrically connected to the panel pads of the second row, a first line electrically connecting the fifth pad and the ninth pad, a third line electrically connecting the seventh pad and the eleventh pad, a fourth line electrically connecting the eighth pad and the twelfth pad and a second line electrically connecting the sixth pad and the third line.

In an embodiment, the first film may include a ninth film pad, a tenth film pad, an eleventh film pad and a twelfth film pad which are electrically connected to the panel pads of the first row.

In an embodiment, the first film may include a film connecting line electrically connecting the ninth film pad, the eleventh film pad and the twelfth film pad.

In an embodiment, a bonding of the first film and a bonding of the second film may be determined by applying a current to the eighth pad and measuring voltages at the fifth pad and the sixth pad.

In an embodiment, a first distance between adjacent ones of the panel pads in the first row may be substantially the same as a second distance between adjacent ones of the panel pads in the second row. The panel connecting lines connecting the panel pads in the first row to the panel pads in the second row may extend in a vertical direction.

In an embodiment, a first distance between adjacent ones of the panel pads in the first row may be greater than a second distance between adjacent ones of the panel pads in the second row. At least one of the panel connecting lines connecting the panel pads in the first row to the panel pads in the second row may have an inclined portion with respect to a vertical direction.

In an embodiment, the display apparatus may further include a first data driver that outputs a first data voltage to the display panel. The first data driver may be disposed on the first film.

In an embodiment, the display apparatus may further include a second data driver that outputs a second data voltage to the display panel. The second data driver may be disposed on the second film In an embodiment, the first data driver may output the first data voltage to odd numbered data lines of the display panel. The second data driver may output the second data voltage to even numbered data lines of the display panel.

In an embodiment, the display apparatus may further include a driving controller that controls the first data driver and the second data driver. The driving controller may be disposed on the printed circuit board.

In an embodiment, a width of a portion of the first film contacting the display panel in a first direction may be greater than a width of a portion of the first film contacting the printed circuit board in the first direction.

In an embodiment, a width of a portion of the second film contacting the display panel in the first direction may be greater than a width of a portion of the second film contacting the printed circuit board in the first direction.

In an embodiment of a display apparatus, the display apparatus may include a display panel, a printed circuit board, a first film electrically connected to the display panel and the printed circuit board and a second film electrically connected to the display panel and the printed circuit board. The display panel may include panel pads of a first row electrically connected to the first film, panel pads of a second row electrically connected to the second film and integrated panel pads connected to the first film and the second film.

According to the embodiments of the display apparatus, the bonding of the chip-on-film structures may be effectively inspected in the display apparatus including the chip-on-film structures.

In an embodiment, each of the integrated panel pads may include a lower portion and an upper portion. The first film may include film pads which are electrically connected to the lower portions of the integrated panel pads. The second film may include pads which are connected to the upper portions of the integrated panel pads.

The display apparatus includes an inspector that simultaneously inspects both the bonding of the first film and the bonding of the second film so that the decrease of the bonding pitch of the printed circuit board may be prevented and the decrease of the yield according to the decrease of the bonding pitch of the printed circuit board may be prevented.

BRIEF DESCRIPTION OF THE DRAWINGS

The above and other features and advantages of the disclosure will become more apparent by describing in detailed embodiments thereof with reference to the accompanying drawings, in which.

DETAILED DESCRIPTION OF THE EMBODIMENTS

Figure 1:
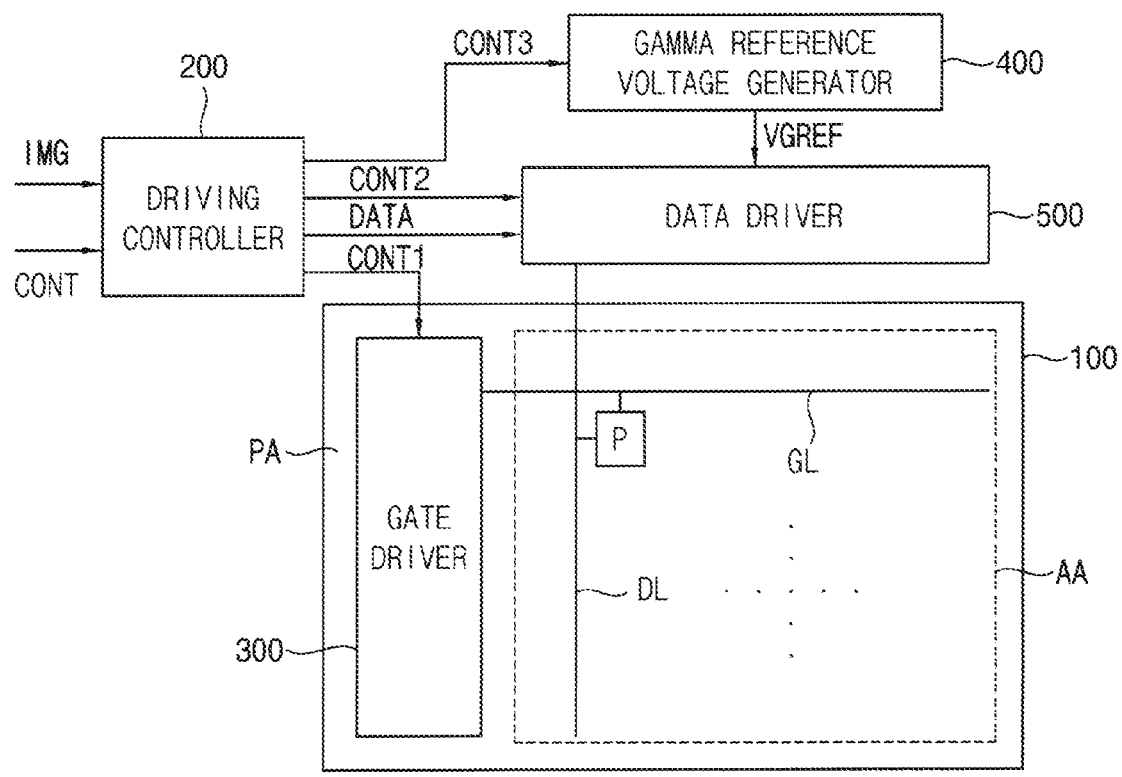
FIG. 1 is a schematic block diagram illustrating a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when an element (or a region, a layer, a portion, or the like) is referred to as "being on", "connected to" or "coupled to" another element in the specification, it can be directly disposed on, connected, or coupled to another element mentioned above, or intervening elements may be disposed therebetween. It will be understood that the terms "connected to" or "coupled to" may include a physical or electrical connection or coupling.

FIG. 1 is a schematic block diagram illustrating a display apparatus according to an embodiment.

Referring to FIG. 1, the display apparatus may include a display panel 100 and a display panel driver. The display panel driver may include a driving controller 200, a gate driver 300, a gamma reference voltage generator 400 and a data driver 500.

For example, the driving controller 200 and the data driver 500 may be integral with each other. For example, the driving controller 200, the gamma reference voltage generator 400 and the data driver 500 may be integral with each other. A driving module including at least the driving controller 200 and the data driver 500 which are integrated with each other may be referred to as a timing controller embedded data driver (TED).

The display panel 100 may have a display region AA on which an image is displayed and a peripheral region PA adjacent to the display region AA.

The display panel 100 may include gate lines GL, data lines DL and pixels connected to the gate lines GL and the data lines DL. The gate lines GL may extend in a first direction D1 (a horizontal direction) and the data lines DL may extend in a second direction D2 that intersects the first direction D1 (a vertical direction).

The driving controller 200 may receive input image data IMG and an input control signal CONT from an external apparatus. The input image data IMG may include red image data, green image data and blue image data. The input image data IMG may include white image data. The input image data IMG may include magenta image data, yellow image data and cyan image data. The input control signal CONT may include a master clock signal and a data enable signal. The input control signal CONT may further include a vertical synchronizing signal and a horizontal synchronizing signal.

The driving controller 200 may generate a first control signal CONT 1, a second control signal CONT2, a third control signal CONT3 and a data signal DATA based on the input image data IMG and the input control signal CONT.

The driving controller 200 may generate the first control signal CONT1 for controlling an operation of the gate driver 300 based on the input control signal CONT, and outputs the first control signal CONT1 to the gate driver 300. The first control signal CONT1 may further include a vertical start signal and a gate clock signal.

The driving controller 200 may generate the second control signal CONT2 for controlling an operation of the data driver 500 based on the input control signal CONT, and may output the second control signal CONT2 to the data driver 500. The second control signal CONT2 may include a horizontal start signal and a load signal.

The driving controller 200 may generate the data signal DATA based on the input image data IMG. The driving controller 200 may output the data signal DATA to the data driver 500.

The driving controller 200 may generate the third control signal CONT3 for controlling an operation of the gamma reference voltage generator 400 based on the input control signal CONT, and may output the third control signal CONT3 to the gamma reference voltage generator 400.

The gate driver 300 may generate gate signals driving the gate lines GL in response to the first control signal CONT1 received from the driving controller 200. The gate driver 300 may output the gate signals to the gate lines GL. For example, the gate driver 300 may sequentially output the gate signals to the gate lines GL.

In an embodiment, the gate driver 300 may be integrated on the peripheral region PA of the display panel 100.

The gamma reference voltage generator 400 may generate a gamma reference voltage VGREF in response to the third control signal CONT3 received from the driving controller 200. The gamma reference voltage generator 400 may provide the gamma reference voltage VGREF to the data driver 500. The gamma reference voltage VGREF may have a value corresponding to a level of the data signal DATA.

In an embodiment, the gamma reference voltage generator 400 may be disposed in the driving controller 200, or in the data driver 500.

The data driver 500 may receive the second control signal CONT2 and the data signal DATA from the driving controller 200, and may receive the gamma reference voltages VGREF from the gamma reference voltage generator 400. The data driver 500 may convert the data signal DATA into data voltages having an analog type using the gamma reference voltages VGREF. The data driver 500 may output the data voltages to the data lines DL.

Figure 2:
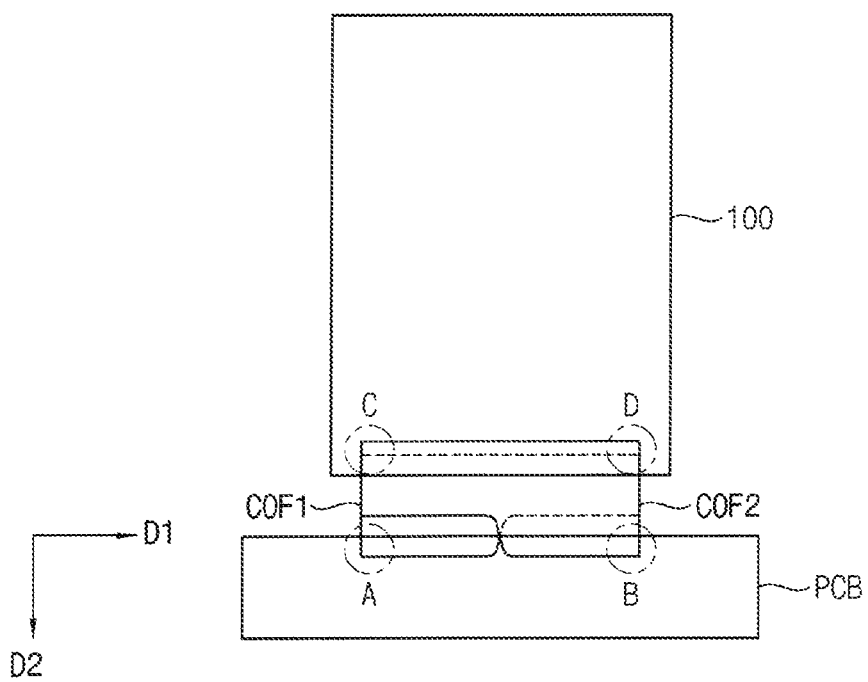
FIG. 2 is a schematic diagram illustrating a display apparatus of FIG. 1.
Figure 3A:
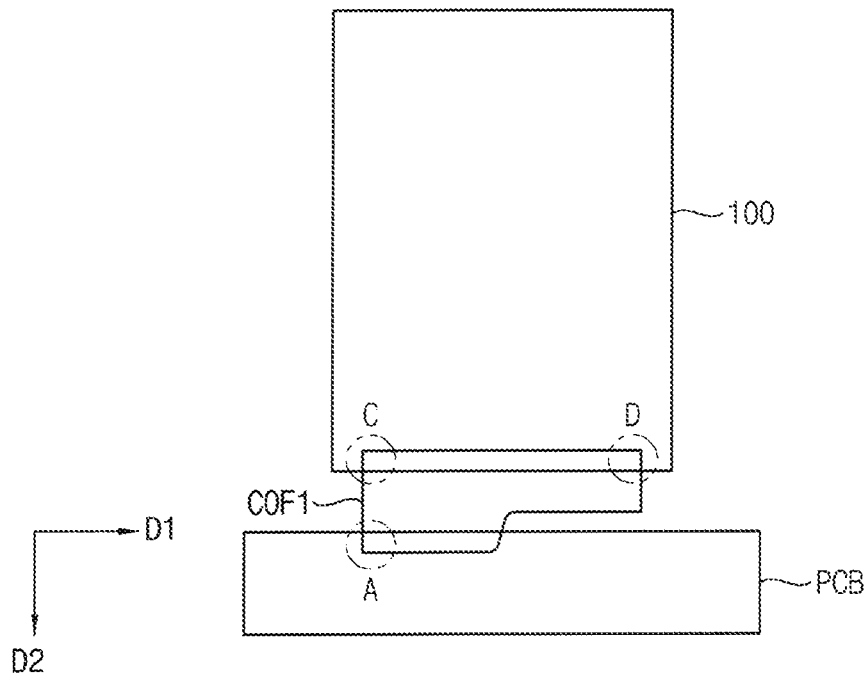
FIG. 3A is a schematic diagram illustrating an arrangement of a display panel, a printed circuit board and a first film of FIG. 2.
Figure 3B:
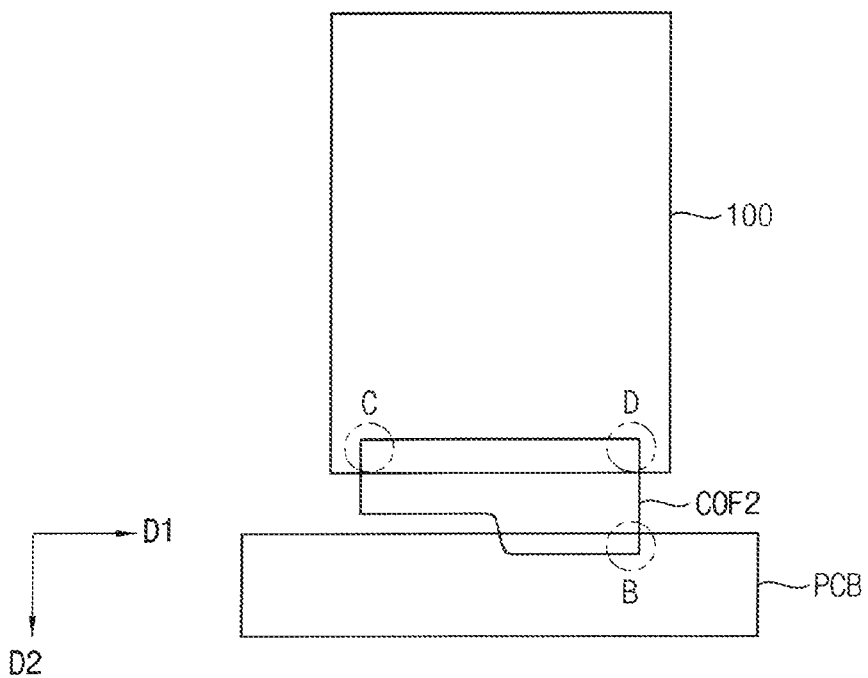
FIG. 3B is a schematic diagram illustrating an arrangement of the display panel, the printed circuit board and a second film of FIG. 2.

FIG. 2 is a schematic diagram illustrating a display apparatus of FIG. 1. FIG. 3A is a schematic diagram illustrating an arrangement of the display panel 100, a printed circuit board PCB and a first film COF1 of FIG. 2. FIG. 3B is a schematic diagram illustrating an arrangement of the display panel 100, the printed circuit board PCB and a second film COF2 of FIG. 2.

Referring to FIGS. 1 to 3B, the display apparatus may include the display panel 100, the printed circuit board PCB, the first film COF1 and the second film COF2.

The first film COF1 may be electrically connected to the display panel 100 and the printed circuit board PCB. The second film COF2 may be electrically connected to the display panel 100 and the printed circuit board PCB. The first film COF1 and the second film COF2 may partially overlap each other.

For example, the first film COF1 may be electrically connected to a first side of the display panel 100. The second film COF2 may be electrically connected to the first side of the display panel 100.

The first film COF1 may be electrically connected to panel pads of the display panel 100 in a first row. The second film COF2 may be electrically connected to panel pads of the display panel 100 in a second row. For example, the panel pads in the first row may be disposed outside the display panel 100 compared to the panel pads in the second row.

FIG. 2 illustrates that the first film COF1 and the second film COF2 may be connected to the display panel 100 and may overlap each other. In FIG. 3A, only the printed circuit board PCB, the first film COF1 and the display panel 100 are illustrated for convenience of explanation. In FIG. 3B, only the printed circuit board PCB, the second film COF2 and the display panel 100 are illustrated for convenience of explanation.

The data driver 500 may include a first data driver outputting a first data voltage to the display panel 100 and a second data driver outputting a second data voltage to the display panel 100.

For example, the first data driver may be disposed on the first film COF1. For example, the second data driver may be disposed on the second film COF2.

For example, the first data driver disposed on the first film COF1 may output the first data voltages to odd numbered data lines of the display panel 100. For example, the second data driver disposed on the second film COF2 may output the second data voltages to even numbered data lines of the display panel 100.

In an embodiment, the driving controller 200 controlling the first data driver and the second driver may be disposed on the printed circuit board PCB.

As shown in FIG. 3A, a width of a portion of the first film COF1 contacting the display panel 100 in the first direction D1 may be greater than a width of a portion of the first film COF1 contacting the printed circuit board PCB in the first direction D1.

As shown in FIG. 3B, a width of a portion of the second film COF2 contacting the display panel 100 in the first direction D1 may be greater than a width of a portion of the second film COF2 contacting the printed circuit board PCB in the first direction D1.

Figure 4:
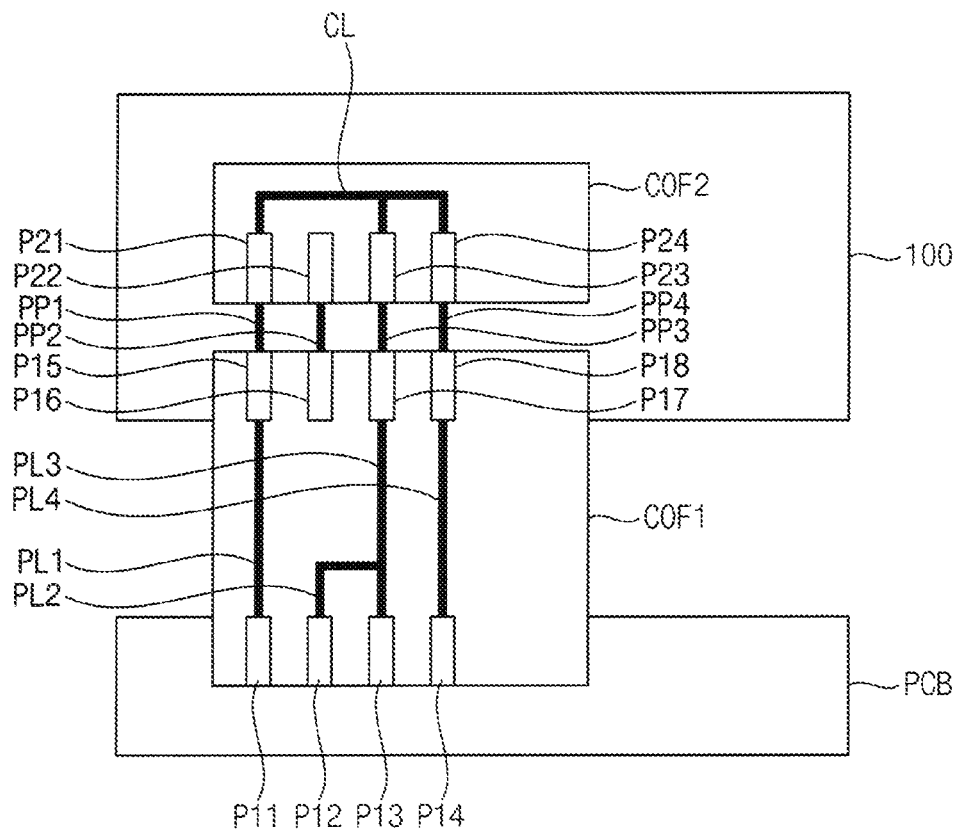
FIG. 4 is a schematic diagram illustrating a first inspector of the display apparatus of FIG. 1.
Figure 5:
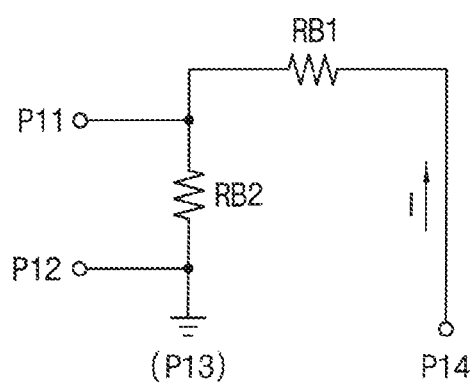
FIG. 5 is a circuit diagram illustrating the first inspector of FIG. 4.
Figure 6:
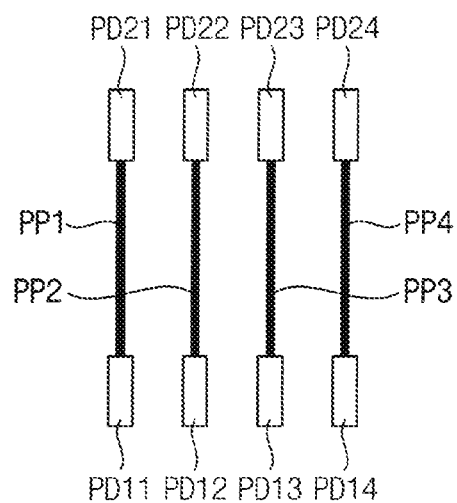
FIG. 6 is a schematic diagram illustrating elements of the display panel included in the first inspector of FIG. 4.

FIG. 4 is a schematic diagram illustrating a first inspector of the display apparatus of FIG. 1. FIG. 5 is a circuit diagram illustrating the first inspector of FIG. 4. FIG. 6 is a schematic diagram illustrating elements of the display panel 100 included in the first inspector of FIG. 4.

Referring to FIGS. 1 to 6, the first inspector may be disposed adjacent to the areas A and C of FIG. 2.

The first film COF1 may include a first film pad P11, a second film pad P12, a third film pad P13 and a fourth film pad P14 electrically connected to the printed circuit board PCB.

The first film COF1 may include a fifth film pad P15, a sixth film pad P16, a seventh film pad P17 and an eighth film pad P18 electrically connected to the panel pads of the display panel 100 in the first row. For example, the fifth film pad P15, the sixth film pad P16, the seventh film pad P17 and the eighth film pad P18 may each be respectively electrically connected to the first panel pad PD11, the second panel pad PD12, the third panel pad PD13 and the fourth panel pad PD14 of the display panel 100.

The first film COF1 may further include a first film line PL1 electrically connecting the first film pad P11 and the fifth film pad P15, a third film line PL3 electrically connecting the third film pad P13 and the seventh film pad P17, a fourth film line PL4 electrically connecting the fourth film pad P14 and the eighth film pad P18 and a second film line PL2 electrically connecting the second film pad P12 and the third film line PL3.

The second film COF2 may include a first pad P21, a second pad P22, a third pad P23 and a fourth pad P24 electrically connected to the panel pads in the second row. For example, the first pad P21, the second pad P22, the third pad P23 and the fourth pad P24 may each be respectively electrically connected to the fifth panel pad PD21, the sixth panel pad PD22, the seventh panel pad PD23 and the eighth panel pad PD24.

The second film COF2 may further include a connecting line CL electrically connecting the first pad P21, the third pad P23 and the fourth pad P24.

The panel pads PD11, PD12, PD13 and PD14 in the first row may each be respectively electrically connected to the panel pads PD21, PD22, PD23 and PD24 in the second row through panel connecting lines PP1, PP2, PP3 and PP4. For example, the first panel connecting line PP1 may electrically connect the first panel pad PD11 and the fifth panel pad PD21. The second panel connecting line PP2 may electrically connect the second panel pad PD12 and the sixth panel pad PD22. The third panel connecting line PP3 may electrically connect the third panel pad PD13 and the seventh panel pad PD23. The fourth panel connecting line PP4 may electrically connect the fourth panel pad PD14 and the eighth panel pad PD24.

In the embodiment, as shown in FIG. 6, a first distance between the adjacent panel pads PD11, PD12, PD13 and PD14 in the first row may be substantially the same as a second distance between the adjacent panel pads PD21, PD22, PD23 and PD24 in the second row.

The panel connecting lines PP1, PP2, PP3 and PP4 electrically connecting the panel pads PD11, PD12, PD13 and PD14 in the first row to the panel pads PD21, PD22, PD23 and PD24 in the second row may extend in a vertical direction (e.g., the second direction D2).

The first to eighth film pads P11, P12, P13, P14, P15, P16, P17 and P18 of the first film COF1, the first to fourth film lines PL1, PL2, PL3 and PLA of the first film COF1, the first to fourth pads P21, P22, P23 and P24 of the second film COF2, the connecting line CL of the second film COF2, the first to eighth panel pads PD11, PD12, PD13, PD14, PD21, PD22, PD23 and PD24 of the display panel 100 and the panel connecting lines PP1, PP2, PP3 and PP4 of the display panel 100 in FIG. 4 may comprise the inspection circuit of FIG. 5.

A current may be applied to the fourth film pad P14 and voltages may be measured at the first film pad P11 and the second film pad P12 so that the bonding of the first film COF1 and the bonding of the second film COF2 may be determined. The bonding of the first film COF1 and the second film COF2 may be represented to following Equation 1.

$$RB2=(VP11-VP12)/I \qquad \text{[Equation 1]}$$

RB2 is a connection resistance, VP11 is a voltage at the first film pad P11, VP12 is a voltage at the second film pad P12, I is a test current applied to the fourth film pad P14. RB1 in FIG. 5 may be a wiring resistance between the first film pad P11 and the fourth film pad P14.

In case that the connection resistance RB2 exceeds a reference value, the bonding of the first film COF1 and the bonding of the second film COF2 may be determined to a defective state. In case that the connection resistance RB2 is equal to or less than the reference value, the bonding of the first film COF1 and the bonding of the second film COF2 may be determined to a normal state.

Figure 7:
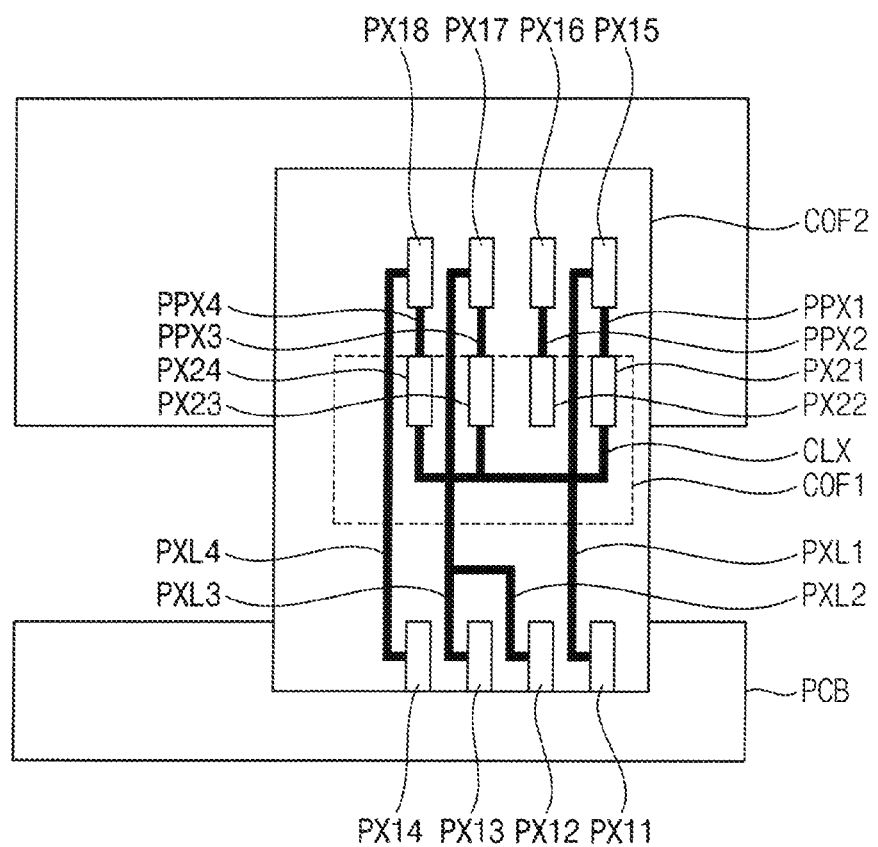
FIG. 7 is a schematic diagram illustrating a second inspector of the display apparatus of FIG. 1.
Figure 8:
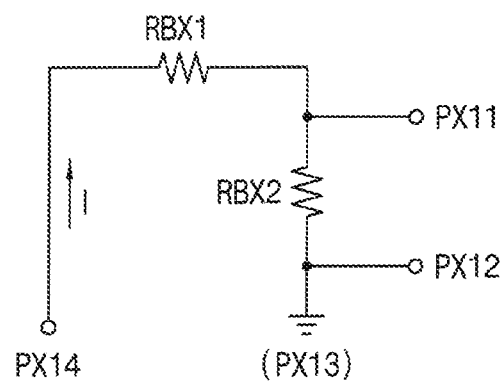
FIG. 8 is a circuit diagram illustrating the second inspector of FIG. 7.
Figure 9:
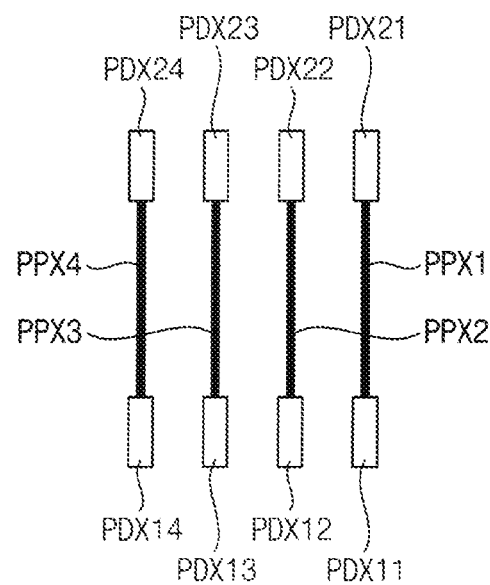
FIG. 9 is a schematic diagram illustrating elements of the display panel included in the second inspector of FIG. 7.

FIG. 7 is a schematic diagram illustrating a second inspector of the display apparatus of FIG. 1. FIG. 8 is a circuit diagram illustrating the second inspector of FIG. 7. FIG. 9 is a schematic diagram illustrating elements of the display panel included in the second inspector of FIG. 7.

Referring to FIGS. 1 to 9, the second inspector may be formed from an area B of FIG. 2 to an area D of FIG. 2

The second film COF2 may include a fifth pad PX11, a sixth pad PX12, a seventh pad PX13 and an eighth pad PX14 electrically connected to the printed circuit board PCB.

The second film COF2 may include a ninth pad PX15, a tenth pad PX16, an eleventh pad PX17 and a twelfth pad PX18 electrically connected to the panel pads of the display panel 100 in the second row. For example, the ninth pad PX15, the tenth pad PX16, the s eleventh pad PX17 and the twelfth pad PX18 may each be respectively electrically connected to a thirteenth panel pad PDX21, a fourteenth panel pad PDX22, a fifteenth panel pad PDX23 and a sixteenth panel pad PDX24.

The second film COF2 may further include a first line PXL1 electrically connecting the fifth pad PX11 and the ninth pad PX15, a third line PXL3 electrically connecting the seventh pad PX13 and the eleventh pad PX17, a fourth line PXL4 electrically connecting the eighth pad PX14 and the twelfth pad PX18 and a second line PXL2 electrically connecting the sixth pad PX12 and the third line PXL3.

The first film COF1 may include a ninth film pad PX21, a tenth film pad PX22, an eleventh film pad PX23 and a twelfth film pad PX24 electrically connected to the panel pads in the first row.

The first film COF1 may further include a film connecting line CLX electrically connecting the ninth film pad PX21, the eleventh film pad PX23 and the twelfth film pad PX24.

The panel pads PDX11, PDX12, PDX13 and PDX14 in the first row may each be respectively electrically connected to the panel pads PDX21, PDX22, PDX23 and PDX24 in the second row through panel connecting lines PPX1, PPX2, PPX3 and PPX4.

The pads PX11, PX12, PX13, PX14, PX15, PX16, PX17 and PX18 of the second film COF2, the first to fourth lines PXL1, PXL2, PXL3 and PXL4 of the second film COF2, the ninth to twelfth film pads PX21, PX22, PX23 and PX24 of the first film COF1, the film connecting line CLX of the first film COF1, the ninth to sixteenth panel pads PDX11, PDX12, PDX13, PDX14, PDX21, PDX22, PDX23 and PDX24 of the display panel 100 and the panel connecting lines PPX1, PPX2, PPX3 and PPX4 of the display panel 100 in FIG. 7 may comprise the inspection circuit of FIG. 8.

A current may be applied to the eighth pad PX14 and voltages are measured at the fifth pad PX11 and the sixth pad PX12 so that the bonding of the first film COF1 and the bonding of the second film COF2 may be determined.

In FIG. 8, RBX2 may be a connection resistance, VPX11 may be a voltage at the fifth pad PX11, VPX12 is may be voltage at the sixth pad PX12 and RBX1 may be a wiring resistance between the fifth pad PX11 and the eighth pad PX14.

In case that the connection resistance RBX2 exceeds a reference value, the bonding of the first film COF1 and the bonding of the second film COF2 may be determined to a defective state. In case that the connection resistance RBX2 is equal to or less than the reference value, the bonding of the first film COF1 and the bonding of the second film COF2 may be determined to a normal state.

According to the embodiment, the bonding of the chip-on-film structures COF1 and COF2 may be effectively inspected in the display apparatus including the chip-on-film structures COF1 and COF2.

The display apparatus includes an inspector that simultaneously inspects both the bonding of the first film COF1 and the bonding of the second film COF2, and may prevent a decrease of the bonding pitch of the printed circuit board PCB. Accordingly a decrease of the yield may be prevented.

Figure 10:
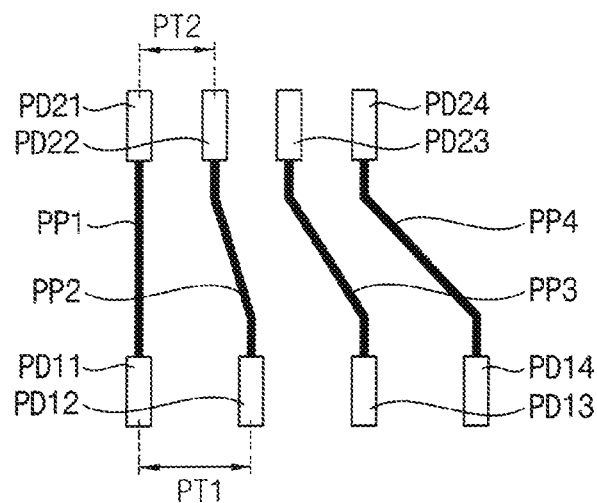
FIG. 10 is a schematic diagram illustrating elements of a display panel included in a first inspector of a display apparatus according to an embodiment.

FIG. 10 is a schematic diagram illustrating elements of a display panel included in a first inspector of a display apparatus according to an embodiment.

The display apparatus according to the embodiment is substantially the same as the display apparatus of the previous embodiment explained referring to FIGS. 1 to 9 except for the panel pads of the display panel. Thus, the same reference numerals will be used to refer to the same or like parts as those described in the previous embodiment of FIGS. 1 to 9 and any repetitive explanation concerning the above elements will be omitted.

Referring to FIGS. 1 to 3B and 10, the display apparatus may include the display panel 100, a printed circuit board PCB, a first film COF1 and a second film COF2.

The first film COF1 may be electrically connected to the display panel 100 and the printed circuit board PCB. The second film COF2 may be electrically connected to the display panel 100 and the printed circuit board PCB. The first film COF1 and the second film COF2 may partially overlap each other.

In the embodiment, a first distance PT1 between the adjacent panel pads PD11, PD12, PD13 and PD14 in the first row may be different from a second distance PT2 between the adjacent panel pads PD21, PD22, PD23 and PD24 in the second row. For example, the first distance PT1 may be greater than the second distance PT2.

For example, at least one of the panel connecting lines PP1, PP2, PP3 and PP4 electrically connecting the panel pads PD11, PD12, PD13 and PD14 in the first row to the panel pads PD21, PD22, PD23 and PD24 in the second row may have an inclined portion with respect to a vertical direction (e.g., the second direction D2). In FIG. 10, the second panel connecting line PP2, the third panel connecting line PP3 and the fourth panel connecting line PP2 may have inclined portions.

According to the embodiment, the bonding of the chip-on-film structures COF1 and COF2 may be effectively inspected in the display apparatus including the chip-on-film structures COF1 and COF2.

The display apparatus includes an inspector that simultaneously inspects both the bonding of the first film COF1 and the bonding of the second film COF2 and prevents a decrease of the bonding pitch of the printed circuit board PCB. Accordingly, a reduction in the yield according to the decrease of the bonding pitch of the printed circuit board PCB may be prevented.

Figure 11:
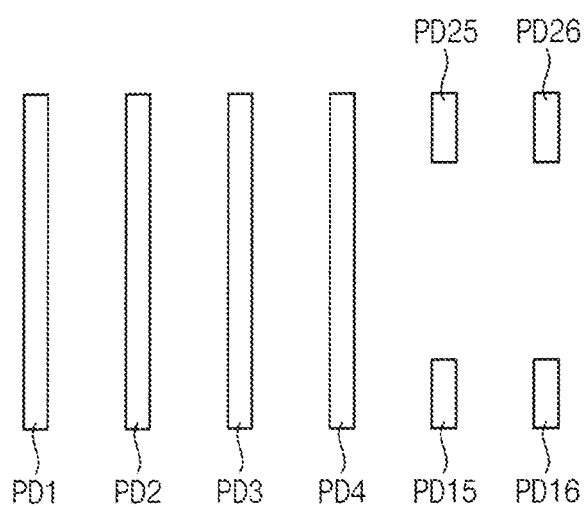
FIG. 11 is a schematic diagram illustrating elements of a display panel included in a first inspector of a display apparatus according to an embodiment.

FIG. 11 is a schematic diagram illustrating elements of a display panel included in a first inspector of a display apparatus according to an embodiment.

The display apparatus according to the embodiment is substantially the same as the display apparatus of the previous embodiment explained referring to FIGS. 1 to 9 except for the panel pads of the display panel. Thus, the same reference numerals will be used to refer to the same or like parts as those described in the previous embodiment of FIGS. 1 to 9 and any repetitive explanation concerning the above elements will be omitted.

Referring to FIGS. 1 to 3B and 11, the display apparatus may include the display panel 100, a printed circuit board PCB, a first film COF1 and a second film COF2.

The first film COF1 may be electrically connected to the display panel 100 and the printed circuit board PCB. The second film COF2 may be electrically connected to the display panel 100 and the printed circuit board PCB. The first film COF1 and the second film COF2 may partially overlap each other.

In the embodiment, the display panel 100 may include panel pads PD15 and PD16 of a first row electrically connected to the first film COF1, panel pads PD25 and PD26 of a second row electrically connected to the second film COF2 and integrated panel pads PD1, PD2, PD3 and PD4 electrically connected to both the first film COF1 and the second film COF2.

The first film COF1 may be electrically connected to the lower portion of the integrated panel pads PD1, PD2, PD3 and PD4 and the second film COF2 may be electrically connected to the upper portion of the integrated panel pads PD1, PD2, PD3 and PD4.

In the embodiment, the configurations of the panel pads PD11 to PD14 of the first row, the panel pads PD21 to PD24 of the second row and the panel connecting lines PP1 to PP4 electrically connecting the panel pads PD11 to PD14 of the first row to the panel pads PD21 to PD24 of the second row of FIG. 6 may be replaced with four integrated panel pads PD1, PD2, PD3 and PD4.

According to the embodiment, the bonding of the chip-on-film structures COF1 and COF2 may be effectively inspected in the display apparatus including the chip-on-film structures COF1 and COF2.

The display apparatus includes an inspector that simultaneously inspects both the bonding of the first film COF1 and the bonding of the second film COF2 so that a decrease of the bonding pitch of the printed circuit board PCB may be prevented. The decrease of the yield due to the decrease of the bonding pitch of the printed circuit board PCB may be prevented.

Figure 12:
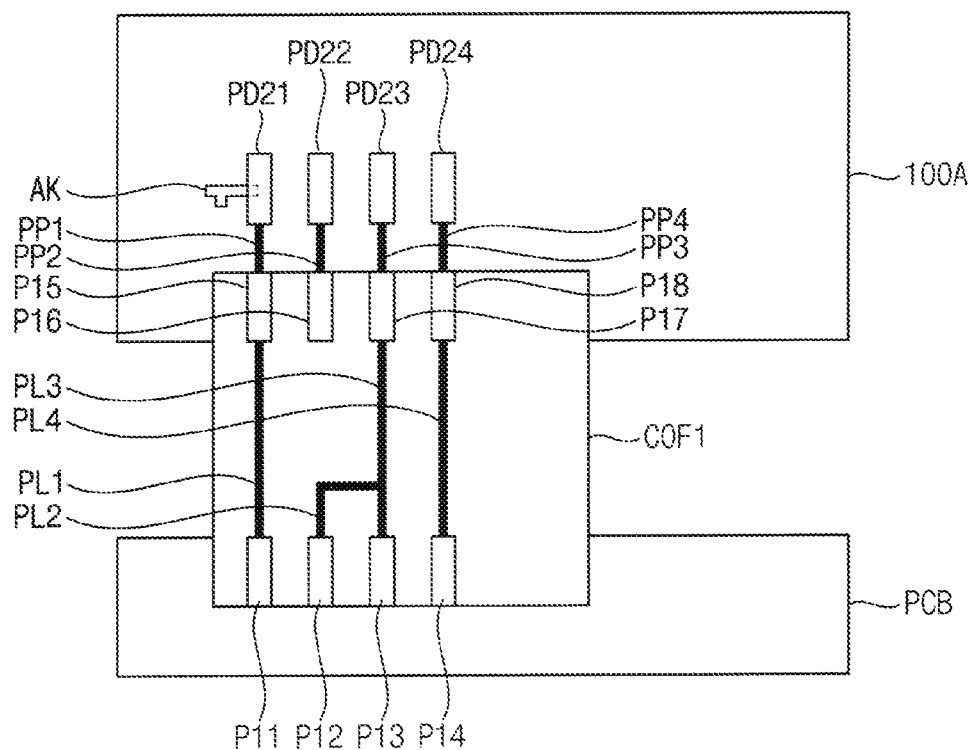
FIG. 12 is a schematic diagram illustrating a first inspector of a display apparatus according to an embodiment.
Figure 13:
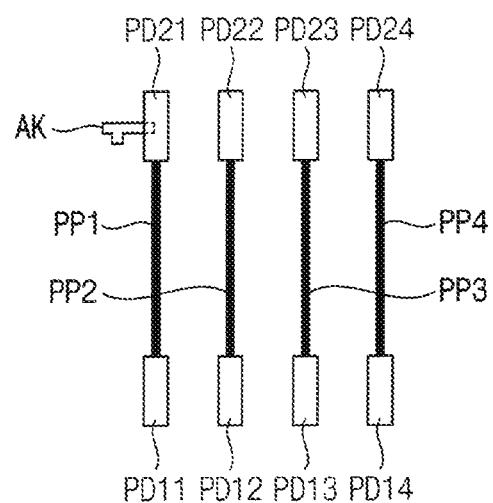
FIG. 13 is a schematic diagram illustrating elements of the display panel included in the first inspector of FIG. 12.

FIG. 12 is a schematic diagram illustrating a first inspector of a display apparatus according to an embodiment. FIG. 13 is a schematic diagram illustrating elements of the display panel included in the first inspector of FIG. 12.

The display apparatus according to the embodiment is substantially the same as the display apparatus of the previous embodiment explained referring to FIGS. 1 to 9 except for the panel pads of the display panel. Thus, the same reference numerals will be used to refer to the same or like parts as those described in the previous embodiment of FIGS. 1 to 9 and any repetitive explanation concerning the above elements will be omitted.

Referring to FIGS. 1 to 3B, 12 and 13, the display apparatus may include the display panel 100, a printed circuit board PCB, a first film COF1 and a second film COF2.

The first film COF1 may be electrically connected to the display panel 100 and the printed circuit board PCB. The second film COF2 may be electrically connected to the display panel 100 and the printed circuit board PCB. The first film COF1 and the second film COF2 may partially overlap each other.

In the embodiment, the display panel 100 may include panel pads PD11, PD12, PD13, PD14 of a first row, panel pads PD21, PD22, PD23, PD24 of a second row and panel connecting lines PP1, PP2, PP3 and PP4 electrically connecting the panel pads PD11, PD12, PD13, PD14 of the first row to the panel pads PD21, PD22, PD23, PD24 of the second row. For example, a first panel connecting line PP1 may electrically connect the first panel pad PD11 and the fifth panel pad PD21. The second panel connecting line PP2 may electrically connect the second panel pad PD12 and the sixth panel pad PD22. The third panel connecting line PP3 may electrically connect the third panel pad PD13 and the seventh panel pad PD23. The fourth panel connecting line PP4 may electrically connect the fourth panel pad PD14 and the eighth panel pad PD24.

In the embodiment, the display panel 100 may further include an align pattern AK electrically connected to at least one of the panel pads of the second row.

When only the first film COF1 is first connected to the display panel 100A and the voltage of the alignment pattern AK may be measured, the bonding state of the first film COF1 may be independently inspected.

According to the embodiments, the bonding of the chip-on-film structures COF1 and COF2 may be effectively inspected in the display apparatus including the chip-on-film structures COF1 and COF2.

The display apparatus includes an inspector that simultaneously inspects both the bonding of the first film COF1 and the bonding of the second film COF2, and may prevent a decrease of the bonding pitch of the printed circuit board PCB. Accordingly, any associated decrease of the yield may be prevented.

According to the display apparatus of the embodiments explained above, a decrease of the bonding pitch of the printed circuit board may be prevented, thereby preventing any associated reduction in the yield of the display apparatus according.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display apparatus comprising: a display panel; a printed circuit board; a first film electrically connected to the display panel and the printed circuit board; and a second film electrically connected to the display panel and the printed circuit board, wherein the display panel comprises: panel pads of a first row electrically connected to the first film; panel pads of a second row electrically connected to the second film; and panel connecting lines electrically connecting the panel pads of the first row to the panel pads of the second row, wherein each of the panel pads of the first row and of the second row are electrically connected to both of the first film and the second film.

2. The display apparatus of claim 1, wherein the first film comprises:
   a first film pad, a second film pad, a third film pad and a fourth film pad which are electrically connected to the printed circuit board;
   a fifth film pad, a sixth film pad, a seventh film pad and an eighth film pad which are electrically connected to the panel pads of the first row;
   a first film line electrically connecting the first film pad and the fifth film pad;
   a third film line electrically connecting the third film pad and the seventh film pad;
   a fourth film line electrically connecting the fourth film pad and the eighth film pad; and
   a second film line electrically connecting the second film pad and the third film line.

3. The display apparatus of claim 2, wherein the second film comprises:
   a first pad, a second pad, a third pad and a fourth pad which are electrically connected to the panel pads of the second row.

4. The display apparatus of claim 3, wherein the second film comprises a connecting line electrically connecting the first pad, the third pad and the fourth pad.

5. The display apparatus of claim 4, wherein a bonding of the first film and a bonding of the second film are determined by applying a current to the fourth film pad and measuring voltages at the first film pad and the second film pad.

6. The display apparatus of claim 1, wherein the display panel comprises an align pattern electrically connected to at least one of the panel pads of the second row.

7. The display apparatus of claim 1, wherein the second film comprises:

a fifth pad, a sixth pad, a seventh pad and an eighth pad which are electrically connected to the printed circuit board;

a ninth pad, a tenth pad, an eleventh pad and a twelfth pad which are electrically connected to the panel pads of the second row;

a first line electrically connecting the fifth pad and the ninth pad;

a third line electrically connecting the seventh pad and the eleventh pad;

a fourth line electrically connecting the eighth pad and the twelfth pad; and a second line electrically connecting the sixth pad and the third line.

8. The display apparatus of claim 7, wherein the first film comprises:

a ninth film pad, a tenth film pad, an eleventh film pad and a twelfth film pad which are electrically connected to the panel pads of the first row.

9. The display apparatus of claim 8, wherein the first film comprises a film connecting line electrically connecting the ninth film pad, the eleventh film pad and the twelfth film pad.

10. The display apparatus of claim 9, wherein a bonding of the first film and a bonding of the second film are determined by applying a current to the eighth pad and measuring voltages at the fifth pad and the sixth pad.

11. The display apparatus of claim 1, wherein a first distance between adjacent ones of the panel pads in the first row is substantially same as a second distance between adjacent ones of the panel pads in the second row, and the panel connecting lines connecting the panel pads in the first row to the panel pads in the second row extend in a vertical direction, and the vertical direction corresponds to and is parallel to a direction that the printed circuit board is spaced apart from the display panel.

12. The display apparatus of claim 1, wherein a first distance between adjacent ones of the panel pads in the first row is greater than a second distance between adjacent ones of the panel pads in the second row, and at least one of the panel connecting lines connecting the panel pads in the first row to the panel pads in the second row has an inclined portion with respect to a vertical direction.

13. The display apparatus of claim 1, further comprising a first data driver that outputs a first data voltage to the display panel, wherein the first data driver is disposed on the first film.

14. The display apparatus of claim 13, further comprising a second data driver that outputs a second data voltage to the display panel, wherein the second data driver is disposed on the second film.

15. The display apparatus of claim 14, wherein the first data driver outputs the first data voltage to odd numbered data lines of the display panel, and the second data driver outputs the second data voltage to even numbered data lines of the display panel.

16. The display apparatus of claim 14, further comprising a driving controller that controls the first data driver and the second data driver, wherein the driving controller is disposed on the printed circuit board.

17. The display apparatus of claim 1, wherein a width of a portion of the first film contacting the display panel in a first direction is greater than a width of a portion of the first film contacting the printed circuit board in the first direction.

18. The display apparatus of claim 17, wherein a width of a portion of the second film contacting the display panel in the first direction is greater than a width of a portion of the second film contacting the printed circuit board in the first direction.

19. The display apparatus of claim 1, wherein at least one of the panel pads is electrically connected to both of the first film and the second film, and the panel pads transmit at least one of electrical signals and voltages from at least one of the printed circuit board, the first film, and the second film to the display panel.

20. A display apparatus comprising: a display panel; a printed circuit board; a first film electrically connected to the display panel and the printed circuit board; and a second film electrically connected to the display panel and the printed circuit board, wherein the display panel comprises: panel pads of a first row electrically connected to the first film; panel pads of a second row electrically connected to the second film; and a plurality of integrated panel pads, each of the plurality of integrated panel pads is electrically connected to both the first film and the second film.

21. The display apparatus of claim 20, wherein each of the integrated panel pads includes a lower portion and an upper portion, the first film includes film pads that are electrically connected to the lower portions of the integrated panel pads, and the second film includes film pads that are electrically connected to the upper portions of the integrated panel pads.

22. The display apparatus of claim 20, wherein each of the integrated panel pads extend in a vertical direction corresponding to a direction that the printed circuit board is spaced apart from the display panel, and each of the integrated panel pads are electrically connected to both of the first film and the second film.

* * * * *